United States Patent
Crane, Jr. et al.

(10) Patent No.: US 6,266,246 B1
(45) Date of Patent: Jul. 24, 2001

(54) MULTI-CHIP MODULE HAVING INTERCONNECT DIES

(75) Inventors: Stanford W. Crane, Jr., Boca Raton; Lakshminarasimha Krishnapura, Delray Beach; Yun Li, Boca Raton; Moises Behar, Boca Raton; Dan Fuoco, Boca Raton; Bill Ahearn, Boca Raton, all of FL (US)

(73) Assignee: Silicon Bandwidth, Inc., Fremont, CA (US)

( * ) Notice: Subject to any disclaimer, the term of this patent is extended or adjusted under 35 U.S.C. 154(b) by 0 days.

(21) Appl. No.: 09/484,047

(22) Filed: Jan. 18, 2000

Related U.S. Application Data

(63) Continuation of application No. 08/970,379, filed on Nov. 14, 1997, now Pat. No. 6,016,256.

(51) Int. Cl.⁷ ...................................................... H05K 7/20
(52) U.S. Cl. .......................... 361/704; 361/813; 361/760; 257/666; 257/724; 174/52.1; 439/68
(58) Field of Search ................................. 361/700–714, 361/721–727, 747, 803, 804, 813; 174/52.3, 16.3, 15.1, 15.2, 252; 257/701–727, 696–699, 672–686, 700; 437/209, 219; 439/68

(56) References Cited

U.S. PATENT DOCUMENTS

| | | | |
|---|---|---|---|
| 3,676,748 | 7/1972 | Kobayashi et al. | 317/101 CM |
| 4,167,647 | 9/1979 | Salera | 174/52 FP |
| 4,423,468 | 12/1983 | Gatto et al. | 361/404 |
| 4,437,718 | 3/1984 | Selinko | 339/61 M |
| 4,677,526 * | 6/1987 | Muehling | 361/386 |
| 4,698,663 | 10/1987 | Sugimoto et al. | 357/81 |
| 4,766,479 | 8/1988 | Krum et al. | 357/74 |
| 4,931,908 | 6/1990 | Boucard et al. | 361/395 |
| 5,081,563 | 1/1992 | Feng et al. | 361/414 |
| 5,137,456 | 8/1992 | Desai et al. | 439/66 |
| 5,138,438 | 8/1992 | Masayuki et al. | 357/75 |
| 5,177,594 * | 1/1993 | Chance et al. | 257/678 |
| 5,220,491 | 6/1993 | Sugano et al. | 361/412 |
| 5,229,917 * | 7/1993 | Harris et al. | 361/386 |
| 5,281,151 | 1/1994 | Arima et al. | 439/68 |
| 5,311,060 * | 5/1994 | Rostoker et al. | 257/796 |
| 5,327,325 | 7/1994 | Nicewarner, Jr. | 361/760 |
| 5,347,429 | 9/1994 | Kohno et al. | 361/813 |
| 5,376,825 | 12/1994 | Tukamoto et al. | 257/685 |
| 5,381,039 * | 1/1995 | Morrison | 257/700 |
| 5,400,003 * | 3/1995 | Kledzik | 333/247 |
| 5,403,784 * | 4/1995 | Hashemi et al. | 437/217 |
| 5,426,563 * | 6/1995 | Moresco et al. | 361/689 |
| 5,432,708 * | 7/1995 | Mohsen | 364/490 |
| 5,438,224 | 8/1995 | Papageorge et al. | 257/777 |
| 5,444,909 * | 8/1995 | Mehr | 29/827 |
| 5,455,387 * | 10/1995 | Hoffman et al. | 174/52.4 |

(List continued on next page.)

FOREIGN PATENT DOCUMENTS

| | | |
|---|---|---|
| 2196178 | 4/1988 | (GB) . |
| 58-066344 | 4/1983 | (JP) . |
| 60-28256 | 2/1985 | (JP) . |
| 62-248243 | 10/1987 | (JP) . |

Primary Examiner—Leo P. Picard
Assistant Examiner—Michael Datskovsky
(74) Attorney, Agent, or Firm—Morgan, Lewis & Bockius LLP

(57) ABSTRACT

A multi-chip module includes a housing having insulative side walls and an end plate, conductive leads extending from the side walls, integrated circuit (IC) dies mounted to the end plate, and one or more interconnect dies mounted to the end plate. The end plate is made from a heat sink material, such as copper. Each interconnect die is positioned between a pair of the IC dies. Electrically conductive material connects the IC dies to the interconnect die, connects the IC dies to the conductive leads, and connects the interconnect dies to the conductive leads. The interconnect dies function to interconnect the IC dies and to interconnect the IC dies to the conductive leads. The interconnect die may be embodied by wiring layers formed on a silicon substrate.

12 Claims, 10 Drawing Sheets

U.S. PATENT DOCUMENTS

| | | | | |
|---|---|---|---|---|
| 5,473,514 | * | 12/1995 | Nagano | 361/813 |
| 5,517,515 | * | 5/1996 | Spall et al. | 371/22.5 |
| 5,530,295 | * | 6/1996 | Mehr | 257/796 |
| 5,541,814 | * | 7/1996 | Janai et al. | 361/778 |
| 5,587,605 | * | 12/1996 | Ramsey et al. | 257/666 |
| 5,625,235 | * | 4/1997 | Takiar | 257/776 |
| 5,701,233 | * | 12/1997 | Carson et al. | 361/735 |
| 5,821,457 | * | 10/1998 | Mosley et al. | 174/52.4 |
| 5,841,638 | * | 11/1998 | Purdom et al. | 361/790 |
| 5,956,229 | * | 9/1999 | Brownell et al. | 361/699 |

* cited by examiner

MULTI-CHIP MODULE HAVING INTERCONNECT DIES

This is a continuation of application(s) application Ser. No. 08/970,379 filed on Nov. 14, 1997 now U.S. Pat. No. 6,016,256.

RELATED APPLICATIONS

This application is related in subject matter to U.S. application Ser. No. 08/208,586, entitled "Prefabricated Semiconductor Chip Carrier", filed Mar. 11, 1994, and expressly incorporated by reference herein, and to U.S. application Ser. No. 08/487,103, entitled "Semiconductor Die Carrier Having Double-Sided Die Attach Plate", filed Jun. 7, 1995, and expressly incorporated by reference herein. Furthermore, this application is related to several other patent applications which are commonly owned by the Assignee of this application. Those related applications are: U.S. Design Patent Application, Ser. No. 36,617 Ser. No. 29/081,929 entitled Computer Cabinet, U.S. Pat. No. 6,031,720 entitled Cooling System for Semiconductor Die Carrier, U.S. Pat. No. 5,951,665 entitled Interface Optimized Computer System Architecture, and U.S. Pat. No. 5,941,617 entitled Decorative Panel for Computer Enclosure, all of which are hereby incorporated by reference.

BACKGROUND OF THE INVENTION

1. Field of the Invention

The present invention relates to a multi-chip module and, more particularly, to a multi-chip module that includes one or more interconnect dies for interconnecting integrated circuit (IC) dies in the multi-chip module and for interconnecting the IC dies to the leads of the multi-chip module.

2. Description of the Prior Art

Operation speed continues to be one of the main selling points for electronic systems, such as computers and other data processing equipment. Increases in operation speed lead to expanded capabilities in graphics, communications, and database applications, to name just a few. One way of increasing the operation speed of an electronic system is to increase the speed of the IC dies used in the electronic system. To date, a great deal of effort has been focused on developing improved designs and architectures for increasing the operation speed of the IC dies.

Several factors besides IC die design affect operation speed in modern electronic systems. For a given architecture, the temperature at which an IC die is operated affects its operation speed. In general, a cool IC die may be reliably operated at higher speeds than a hot IC die. Modern high speed dies have demanding cooling requirements, and future designs are likely to be even more demanding. Accordingly, the ability to cool IC dies is an important factor in obtaining reliable, high speed operations of electronic systems.

In addition, as the operation speeds of IC dies increase, the propagation delay of signals passing between IC dies in the electronic system becomes significant. Propagation delay increases as the length of the wiring path between IC dies increases. However, simply locating IC dies closer together to reduce the wiring path between the IC dies presents several difficulties. For one thing, configurations with a high concentration of IC dies are difficult to cool. Therefore, any reduction in propagation delay may be more than offset by a reduction in the operating speed of the IC dies.

Multi-chip modules, which are sometimes referred to as multi-chip carriers, have been proposed as a way to miniaturize electronic systems. Multi-chip modules are semiconductor die carriers that house multiple semiconductor IC dies. The multi-chip modules generally include an insulative housing that protects and supports the IC dies and a plurality of leads that extend from the housing to couple electrical signals to and from the IC dies. The IC dies are active components, such as a microprocessor die and a static random access memory (SRAM) die.

In conventional multi-chip modules, the insulative housing holds the IC dies in one of two different arrangements. In a first arrangement, the IC dies are mounted back-to-back to an insulative substrate. Alternatively, the IC dies are mounted side-by-side on a planar substrate.

The back-to-back arrangement has several deficiencies. For example, the back-to-back arrangement limits the number of IC dies that may be housed in a single package. In addition, the back-to-back arrangement does not permit efficient interconnection between the IC dies within the housing or the efficient transfer of heat away from the IC dies. Moreover, in the back-to-back arrangement, the back of the dies are mounted to the interior of the module. This effectively traps heat in the module and, thus, limits the operation speed of the IC dies.

In the side-by-side arrangement, the IC dies in the multi-chip module are interconnected by a multilayer ceramic or multilayer printed circuit board (PCB) inter connectors. However, the ceramic and PCB inter connectors are relatively expensive to manufacture. In addition, these interconnectors typically require numerous layers, which not only adds to the expense, but block the transfer of heat from the IC dies to the exterior of the multi-chip module, thereby preventing effective cooling of the IC dies. Because these interconnectors typically require numerous layers PCB size, as well as pad and trace size become an issue.

Accordingly, there exists a need in the art to provide an economical multi-chip module that supports high speed applications

SUMMARY OF THE INVENTION

The present invention has been made in view of the above circumstances and has as an object to provide a multi-chip module having an inexpensive and reliable interconnect system.

A further object of the present invention is to provide a multi-chip module that effectively supports high speed applications.

A further object of the invention is to provide a multi-chip module capable of efficiently transferring heat from the integrated circuit dies housed within the multi-chip module to the outside of the multi-chip module.

A further object of the invention is to provide a multi-chip module in which the die interconnect component includes logic for selectively routing signals between the integrated circuit dies mounted in the multi-chip module.

A further object of the invention is to provide a multi-chip module in which the integrated circuit die interconnect component has substantially the same thermal expansion coefficient as the integrated circuit dies.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a multi-chip module for housing multiple integrated circuit dies that includes a housing, a plurality of electrically conductive leads held in the housing, first and second integrated circuit dies mounted within the housing, and an interconnect die mounted within the housing between the first and second integrated circuit dies. Each of the conductive leads includes an internal lead section extending within the housing and an external lead section extending outside of the housing. The interconnect die is electrically connected to the internal lead section of at least one of the electrically conductive leads. The interconnect die transmits signals between the first integrated circuit die, the second integrated circuit die, and the at least one conductive lead.

In one preferred embodiment, the interconnect die receives signals from the first integrated circuit die and outputs the received signals to the second integrated circuit die, and receives signals from the at least one conductive lead and outputs the received signals to at least one of the first and second integrated circuit dies.

The housing may include a plurality of insulative side walls that define at least a portion of the exterior surface of the housing, with the plurality of conductive leads held in the side walls, for example, in multiple, vertically-spaced tiers. The insulative side walls may receive the conductive leads in a plurality of tombstone-shaped openings.

The housing may further include an end plate joined to the insulative side walls, the end plate being formed of a heat sink material, such as copper. The first and second integrated circuit dies and the interconnect die may be mounted to the end plate.

The interconnect die may include a silicon substrate, a plurality of bonding pads, and wiring layers connecting pairs of the bonding pads. The interconnect die may include only passive components and the first and second integrated circuit dies may include active components.

The invention further comprises a multi-chip module for housing multiple integrated circuit dies that includes a housing having a plurality of insulative side walls and an end plate, where the end plate joined to the side walls to define a cavity. A plurality of electrically conductive leads are held in the side walls, each of the conductive leads includes an internal lead section extending within the cavity and an external lead section extending outside of the housing. A plurality of integrated circuit dies and a plurality of interconnect dies are mounted to the end plate within the cavity. Each interconnect die is positioned adjacent to at least two of the plurality of integrated circuit dies. Electrically conductive material electrically connects the electrically conductive leads, the integrated circuit dies, and the interconnect dies.

The electrically conductive material may couple (1) at least one of the interconnect dies to the internal lead section of at least one of the conductive leads, (2) at least one of the integrated circuit dies to the internal lead section of at least one other of the conductive leads, and (3) the integrated circuit dies to the interconnect dies. At least one of the interconnect dies may receive signals from at least one of the integrated circuit dies and output the received signals either to the electrically conductive leads or to another of the integrated circuit dies.

At least one of the interconnect dies may comprise a first bonding pad electrically coupled to a first one of the integrated circuit dies by the electrically conductive material, a second bonding pad electrically coupled to either a second one of the integrated circuit dies or one of the electrically conductive leads by the electrically conductive material, and a wiring path coupling the first bonding pad to the second bonding pad.

A first one of the interconnect dies may comprise a first bonding pad electrically coupled to a first one of the integrated circuit dies by the electrically conductive material, a second bonding pad electrically coupled to a third bonding pad of a second one of the interconnect dies by the electrically conductive material, and a wiring path coupling the first bonding pad to the second bonding pad. The second one of the interconnect dies may comprise the third bonding pad, a fourth bonding pad electrically coupled to either a second one of the integrated circuit dies or one of the conductive leads by the electrically conductive material, and a wiring path coupling the third bonding pad to the fourth bonding pad.

The invention further comprises a multi-chip module for housing multiple integrated circuit dies including a housing having a plurality of insulative side walls and an end plate joining the side walls to define a cavity, a plurality of electrically conductive leads held in the side walls, first, second, third, and fourth integrated circuit dies mounted to the end plate within the cavity, first, second, third, and fourth interconnect dies mounted to the end plate within the cavity, and electrically conductive material coupling the conductive leads and the interconnect dies, the conductive leads and the integrated circuit dies, and the integrated circuit dies and the interconnect dies. Each of the conductive leads include an internal lead section extending within the cavity and an external lead section extending outside of the housing. In addition, the first interconnect die is mounted between the first and second integrated circuit dies, the second interconnect die mounted between the second and third integrated circuit dies, the third interconnect die mounted between the third and fourth integrated circuit dies, and the fourth interconnect die mounted between the first and fourth integrated circuit dies.

Each of the interconnect dies may comprise a silicon substrate. The housing may include four side walls joined together in a rectangular shape and the first, second, third, and fourth integrated circuit dies may be mounted to the end plate adjacent the corners of the side walls, respectively. The interconnect dies may be rectangular-shaped, with the first and third interconnect dies positioned end-to-end with respect to each other and the second and fourth interconnect dies positioned end-to-end with respect to each other and separating the first and third interconnect dies.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiment(s) of the invention and together with the description, serve to explain the principles of the invention.

DESCRIPTION OF THE PREFERRED EMBODIMENT

Reference will now be made in detail to the present exemplary embodiment(s) of the invention illustrated in the accompanying drawings. Wherever possible, the same reference numbers will be used throughout the drawings to refer to the same or like parts.

Figure 1:
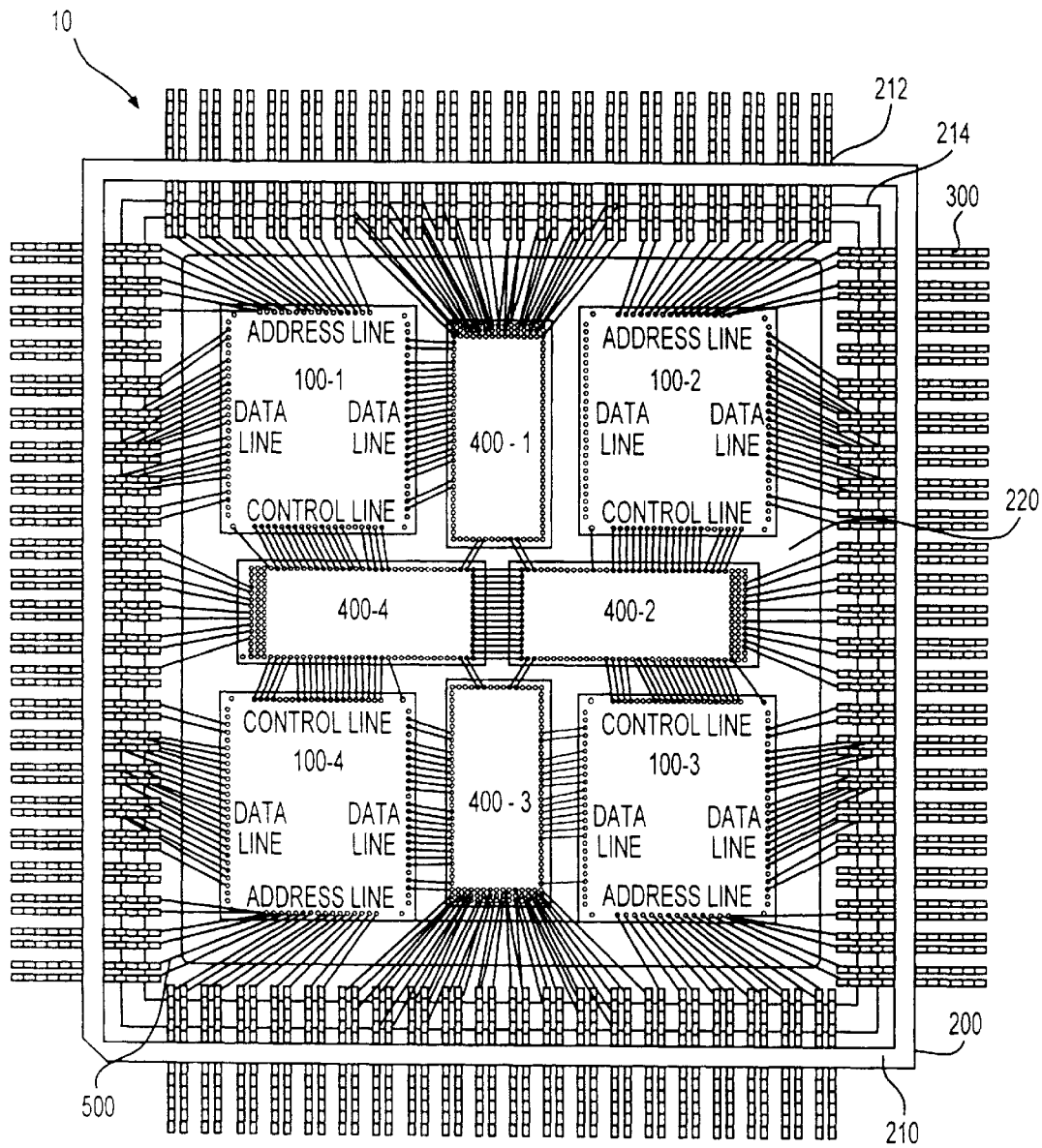
FIG. 1 illustrates an embodiment of a multi-chip module in accordance with the present invention, in which IC dies are coupled to leads projecting from the multi-chip module.

FIG. 1 illustrates an embodiment of a multi-chip module 10 according to the present invention. The multi-chip module 10 includes multiple IC dies 100, a housing 200, leads 300, one or more interconnect dies 400, and electrically conductive material 500 for electrically connecting IC dies 100, leads 300, and interconnect dies 400. The multi-chip module may embody a cavity-down or flip-chip configuration in which, if the multi-chip module 10 were mounted to a printed circuit board, the dies 100 and 400 would face the printed circuit board. Of course, the multi-chip module may be embodied in a cavity-up configuration as well.

By way of example, FIG. 1 shows four IC dies 100-1, 100-2, 100-3, and 100-4. Of course, the multi-chip module 10 may include any plural number of IC dies 100. The IC dies 100 may be any active integrated circuit component. For example, the IC dies 100 may include one or more microprocessor dies; application specific integrated circuit (ASIC) dies; various sensor dies; memory dies, such as, but not limited to, dynamic random access memory (DRAM), static random access memory (SRAM), video random access memory (VRAM), electrically erasable programmable read-only memory (EEPROMs), and flash memory, among others; semiconductor lasers or LEDs; charge-coupled devices; or other processing, logic- and/or sensing dies, or any combination of these components. In one preferred embodiment, IC dies 100 comprise four SRAM dies.

The housing 200 and leads 300 will now be described in detail with reference to FIGS. 2–6. It should be understood that the housing and lead arrangements may be applied not only to multi-chip modules but to single die carriers as well.

Figure 2:
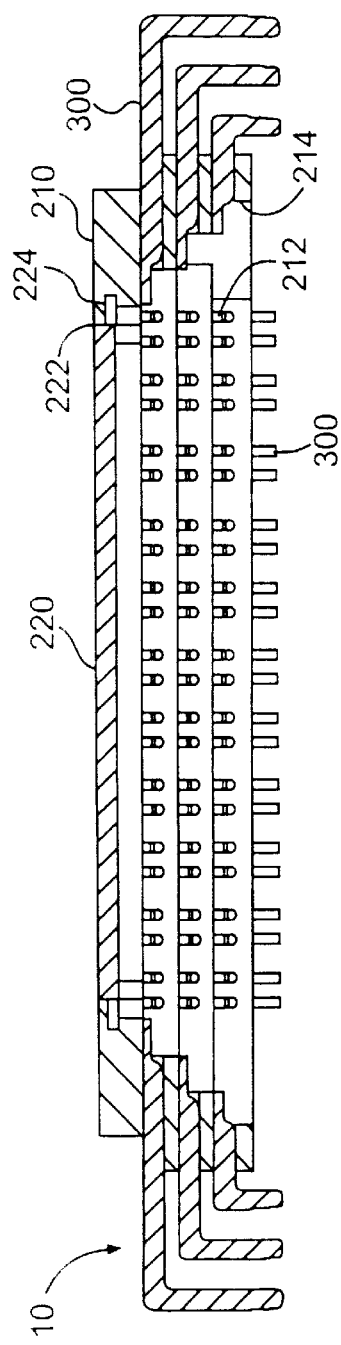
FIG. 2 provides a partial cross-sectional view of the multi-chip module shown in FIG. 1.
Figure 3:
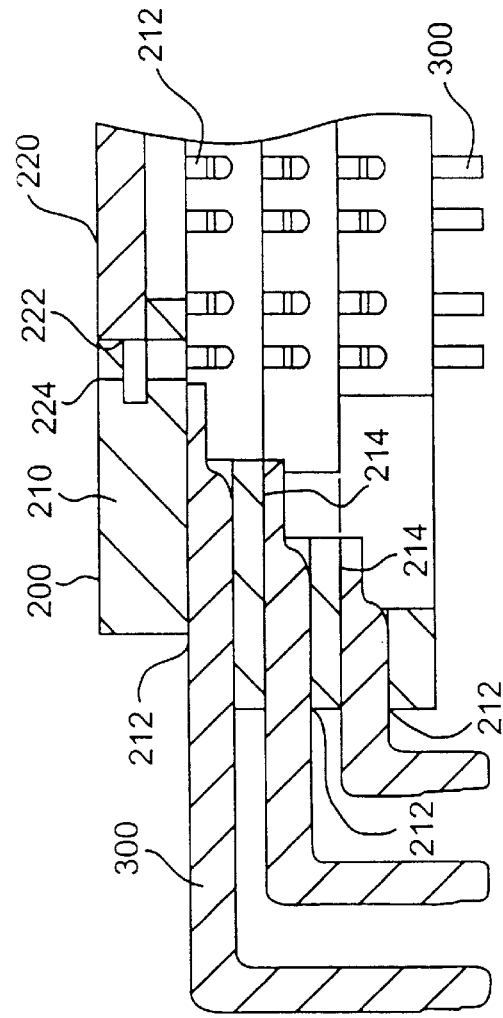
FIG. 3 provides a detailed view of the cross-sectional view of FIG. 2.
Figure 4:
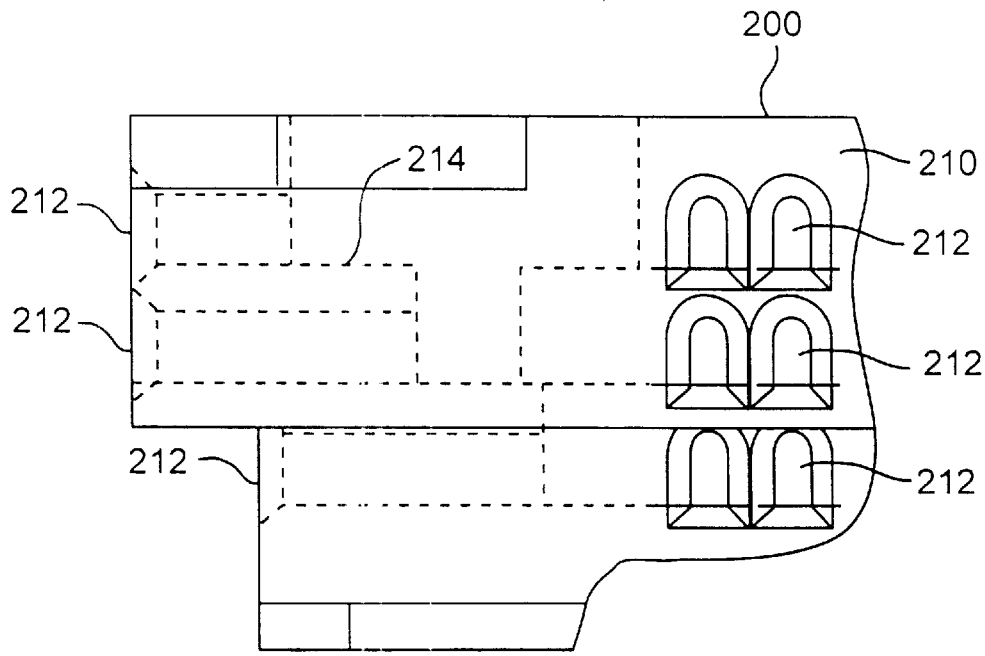
FIG. 4 provides a detailed view of a side wall of a multi-chip module according to the present invention.
Figure 5:
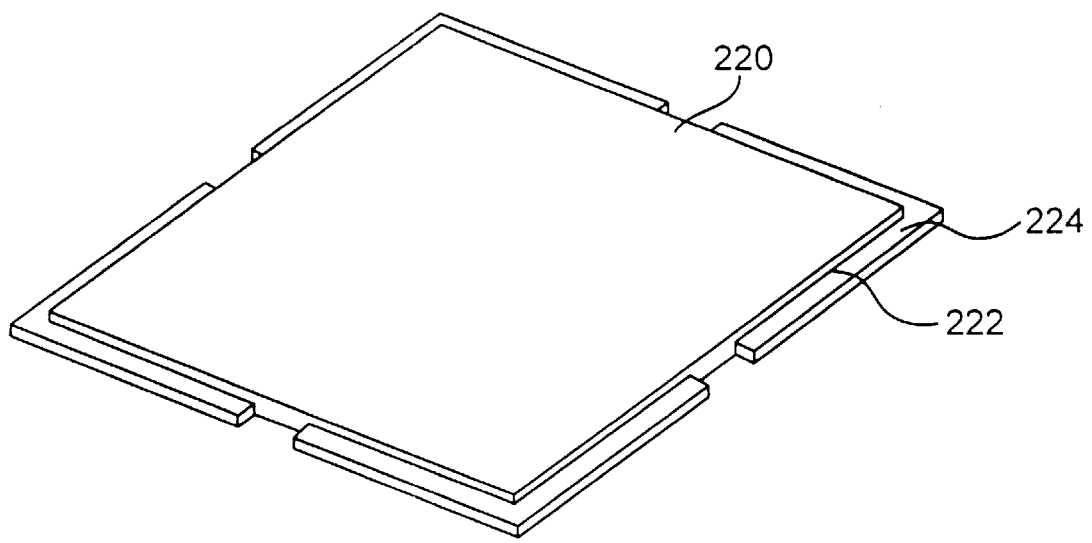
FIG. 5 illustrates one embodiment of an end plate of a multi-chip module according to the present invention.

FIG. 2 provides a cross sectional view of the housing 200 and leads 300 of the multi-chip module 10. FIG. 3 is a detailed view of one end of FIG. 2. As shown in FIGS. 2 and 3, the housing 200 includes side walls 210 and an end plate 220. In one preferred embodiment, one or more of the side walls 210 may include openings 212 formed therethrough for receiving leads 300. As best seen in FIG. 4, the openings 212 are preferably shaped like tombstones, i.e., generally rectangular with two square corners opposite two rounded corners, to facilitate retention and accurate positioning of the leads 300. The openings 212 may be arranged in multiple, vertically spaced rows. For example, two, three, or four or more vertically spaced rows of openings 212 may be provided. As shown in FIGS. 2 and 3, the openings 212 may be aligned vertically. Of course, the openings 212 in adjacent rows may be staggered.

In each row, the openings 212 may be arranged in pairs, such that each pair of openings is spaced apart a distance greater than the distance that the openings 212 in each pair are spaced from each other. This spacing preferably corresponds to the spacing of the leads 300, which facilitates bonding arrangements on a printed circuit board to which the multi-chip module may be mounted.

FIGS. 2 and 3 show that the inner surface of side walls 210 may include steps 214 that are aligned with openings 212 for supporting and locating multiple tiers of leads 300. The side walls 210 are preferably molded from an insulative, polymeric material, such as a liquid crystal polymer. One suitable liquid crystal polymer is VECTRA™ which is available from Hoechst-Celanese. Of course, housing 200 may be made of any suitable organic or inorganic material or combination of materials. The openings 212 may be molded into the side walls 210 or may be formed after molding by removing material from the side walls 210.

The end plate 220 may be formed of the same material as the side walls 210 and integrally molded with the side walls 210, or the end plate 220 may be formed separately and then attached. The thickness of the end plate 220 may be uniform. Alternatively, as shown for example in FIG. 5, the periphery of the end plate 220 may include a step 222 and a narrowed peripheral portion 224. When molded into the side walls 210, the narrowed peripheral portion 224 increases the length of the interface between the side walls 210 and the end plate 220, thereby more effectively preventing moisture and other possible contaminants from entering the housing 200.

In a preferred embodiment, the side walls 210 and end plate 220 are made from different materials. For example, the end plate 220 may be made of a heat sink material or combination of materials, such as copper, copper with a diamond coating, copper with a black oxide coating, or other material(s) having a high thermal conductivity. The IC dies 100 and the interconnect dies 400 may be mounted directly to the end plate 220. This enables heat generated by the IC dies and the interconnect dies to be efficiently transferred to the exterior of the multichip module 10 through the end plate 220. Cooling structure may be mounted to the opposite (external) side of the end plate 220. For example, cooling fins, a fan, an electrothermal cooling plate, or a combination of these features may be coupled to the external side of end plate 220. In one preferred embodiment, the end plate 220 may be equipped with the cooling device disclosed in U.S. application Ser. No. 08/970,503, filed concurrently herewith, and incorporated by reference herein.

Figure 6:
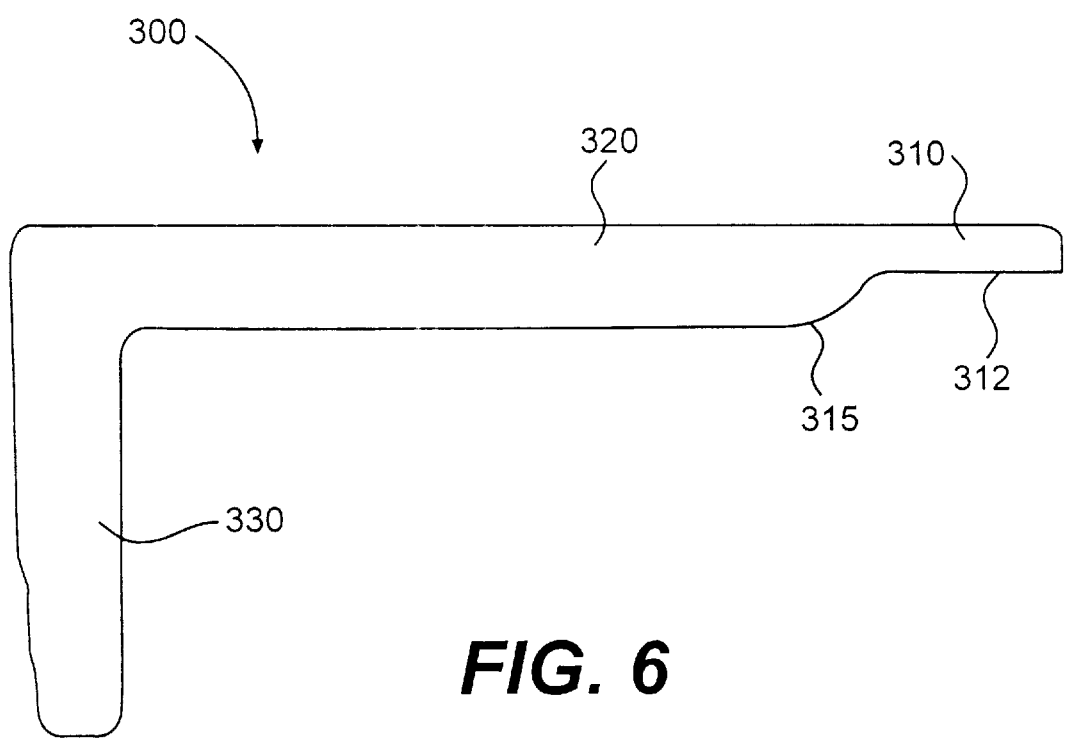
FIG. 6 illustrates a lead for use in a multi-chip module according to the present invention.

FIG. 6 illustrates one embodiment of the conductive leads 300. As shown in FIG. 6, the conductive leads 300 are preferably IL-shaped. The conductive leads 300 each include an internal lead section 310, a stabilizing section 320, and an external lead section 330. The internal lead section 310 resides inside the housing 200. The internal lead section 310 may be relatively narrow compared to the stabilizing section 320 to facilitate insertion of the lead 300 into the opening 212 of the housing 200. A sloping transitional section 315 couples the internal lead section 310 to the stabilizing section 320. Sloping transitional section 315 prevents the lead from digging in upon insertion. The internal lead section 310 includes a flat bonding surface 312 for contacting the electrically conductive material 500. The bonding surface 312 may be plated with gold or another highly conductive material to ensure a reliable electrical connection.

Stabilizing section 320 frictionally engages the inner walls of housing 200 in opening 212. The strength of the frictional engagement may be sufficient to retain lead 300 in housing 200. Alternatively, the leads 300 may be bonded to the housing 200 using a suitable adhesive. In a preferred embodiment, the stabilizing section 320 has a rectangular cross section with its height greater than its width. When the opening 212 is tombstone-shaped, the rounded corners of the opening 212 force the sides of stabilizing section 320 against the flat sides of the opening 212, which are opposite the rounded corners, to accurately position the lead 300 against the step 214. In addition, the corners of the stabilizing section 320 of the lead 300 press into the rounded corners of the opening 212 to help secure the lead 300.

The external lead section 330 extends from the side wall 210 of the housing 200 and may have the same axial dimensions as the stabilizing section 320 to produce robust, rigid leads that inhibit bending. The leads 300 may be arranged in multiple, vertically spaced rows or tiers through the side walls 210. The tiers of leads 300 tiers are preferably aligned vertically. Within each tier, the leads 300 may be grouped into pairs such that the distance between each pair of leads is greater than the distance between each lead in a pair. This arrangement facilitates bonding pad design on a printed circuit board (PCB). The ends of external lead sections 330 may be shaped for surface mounting to bonding pads on the surface of a printed circuit board. Of course, the ends of the external lead sections 330 may be mounted to a printed circuit board or other substrate by other means, such as, for example, plated through hole (PTH) technology.

The leads 300 are preferably stamped from a metal blank into an L-shape and then finished by machining. In this way, the leads 300 are extremely rigid because they are not bent or designed to be bent during manufacture.

The interconnect dies 400 function to transmit or route signals between the IC dies 100 and/or between an IC die 100 and a conductive lead 300. In this regard, an interconnect die 400 may form part of the electrical path between two IC dies 100 or between an IC die and a conductive lead 300. Of course, the signal path between two IC dies 100 or between an IC die 100 and a conductive lead 300 may include two or more interconnect dies 400. In one preferred embodiment, the interconnect die 400 will receive a signal from an IC die 100 or a conductive lead and output the signal to another IC die 100 or to a conductive lead 300. In this regard, the interconnect die 400 functions similar to a printed circuit board with wiring traces.

Figure 7:
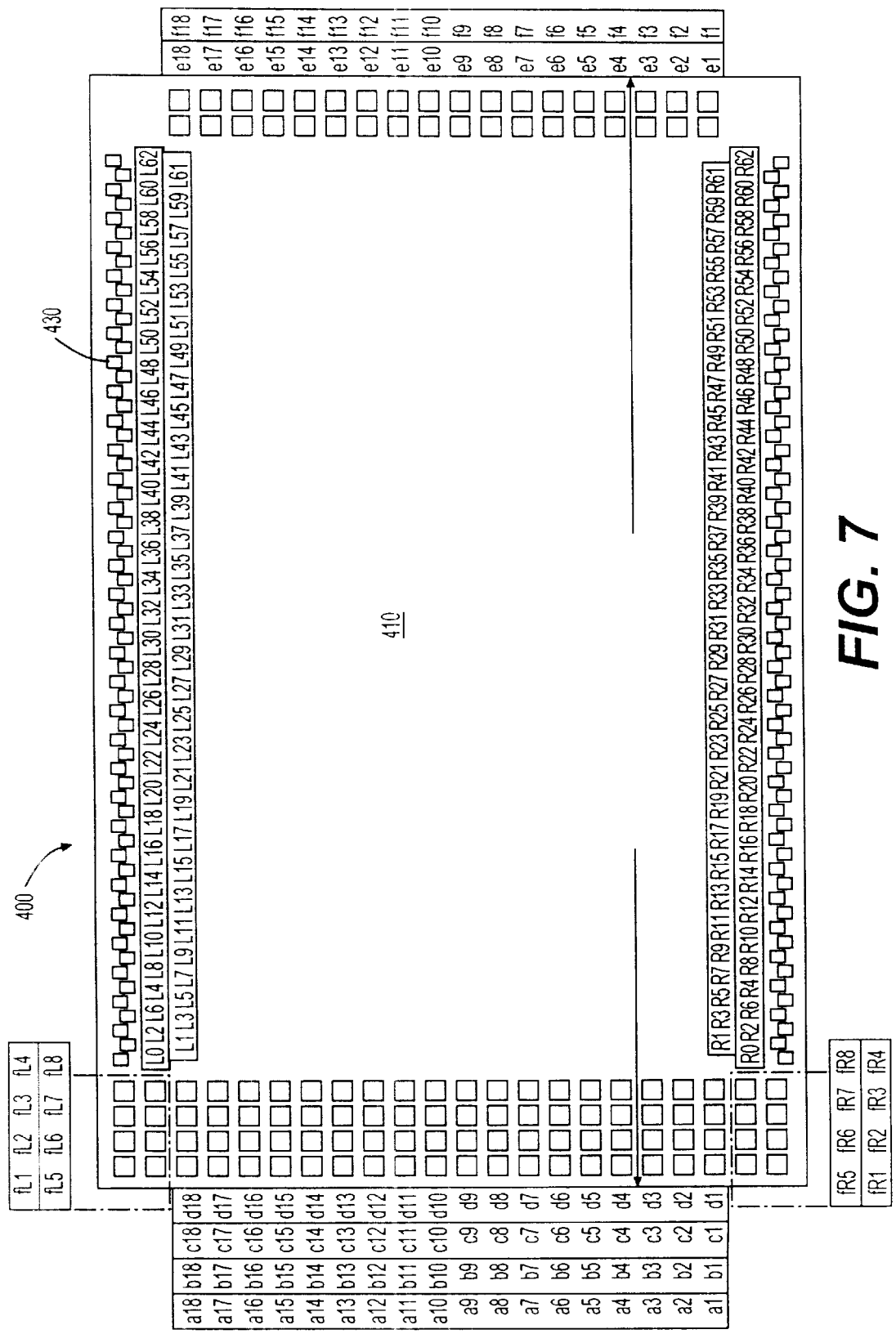
FIG. 7 illustrates an embodiment of an interconnect die 400.

FIG. 7 illustrates one embodiment of an interconnect die 400. As shown in FIG. 7, the interconnect die 400 includes a substrate 410 and bonding pads 430. The bonding pads 430 may be provided in multiple rows along the periphery of an upper face of the substrate 410 to facilitate connection to IC dies 100, to other interconnect dies 400, and/or to the conductive leads 300 via conductive material 500. As shown, the rows of bonding pads 430 may be aligned or, alternatively, may be staggered. A plurality of conductive wiring paths 420 (not shown) connect pairs of bonding pads 430.

Figure 8:
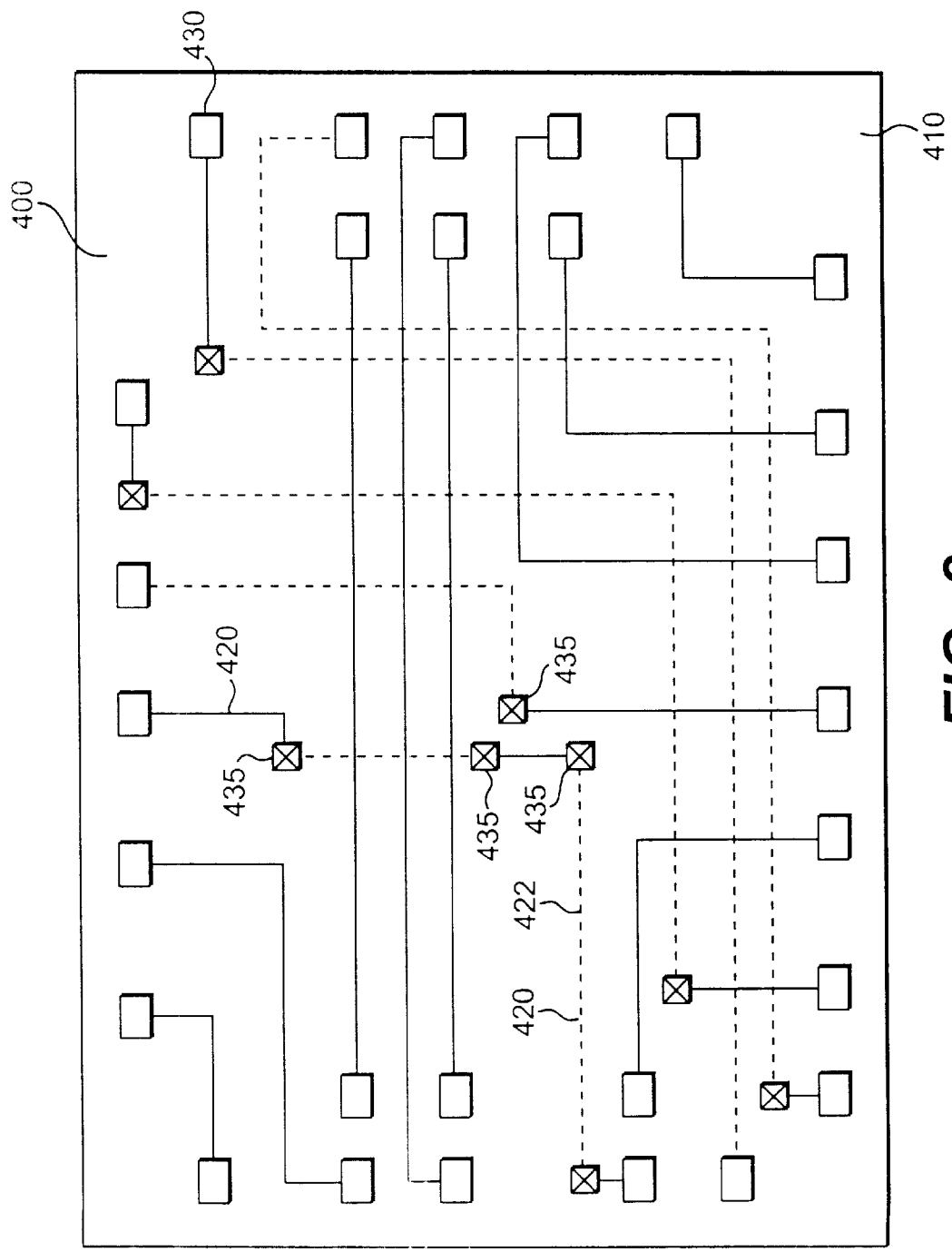
FIGS. 8 and 9 provide a detailed illustration of an interconnect die 400.
Figure 9:
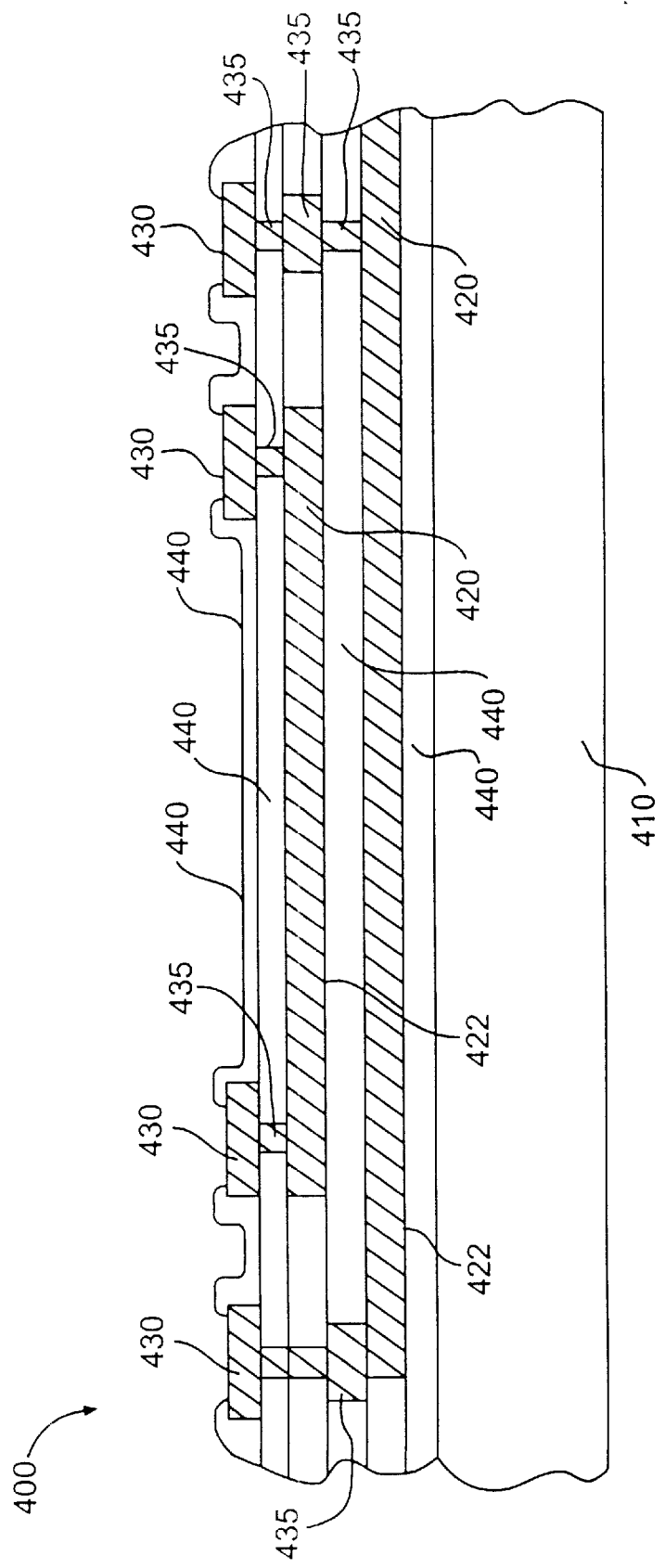

FIG. 8 and 9 provide a detailed illustration of an interconnect die 400. As shown in FIGS. 8 and 9, the interconnect die 400 includes conductive wiring paths 420 coupling pairs of bonding pads 430. The wiring paths 420 may be formed using multiple wiring layers 422 formed on the substrate 410. One or more insulative layers 440 may be provided to insulate between the wiring layers 422. Contact holes 445 may be provided through the insulative layers 440 to enable interlayer connection of the wiring layers 422 and/or connection of the wiring layers 422 to the bonding pads 430. The interconnect dies 400 may be manufactured in the same well known manner as the wiring and interconnect layers on IC dies. For example, the wiring layers 422 may be deposited, for example, by chemical vapor deposition and/or sputtering, and the insulative layers 440 may be grown or deposited. The wiring layers 422 and insulative layers 440 may be patterned as necessary using known photo or x-ray lithography techniques, for example, to form the various patterns and interlevel contacts. In this way, the wiring layers 422 may be formed as wide as 2–4 $\mu$m or less, compared with about 25 $\mu$m of ceramic or PCB substrates.

The substrate 410 may be formed of silicon, gallium arsenide, or another semiconductor material, or of an insulative material, such as glass. The conductive wiring layers 422 may be formed of aluminum, copper, tungsten, titanium, or alloys thereof, among other metals and metal alloys, or doped polysilicon. Of course, the wiring layers 420 may be protected by various barrier layers, as is known in the art. In a preferred embodiment, the substrate 410 is formed of silicon, which has the same thermal expansion properties as the IC dies 100, and the wiring layers 422 are made of copper with gallium arsenide.

In one preferred embodiment, the interconnect dies 400 are passive components, e.g., formed only of wiring paths 420 coupling pairs of bonding pads 430. Alternatively, one or more of the interconnect dies 400 may include control logic and routing components to enable selective connection of various bonding pads. Also, one or more of the interconnect dies 400 may include a built-in self-test feature. The routing components may comprise switching devices operated by the control logic that selectively connect pairs of bonding pads 430. For example, the control logic and routing components may comprise transistors formed in or on the substrate 410, such as in an epitaxial layer formed on the substrate 410. In this case, one or more of the bonding pads 430 may be used to receive control signals for supply to the control logic to enable selection of the routing paths on the interconnect die 400.

Figure 10:
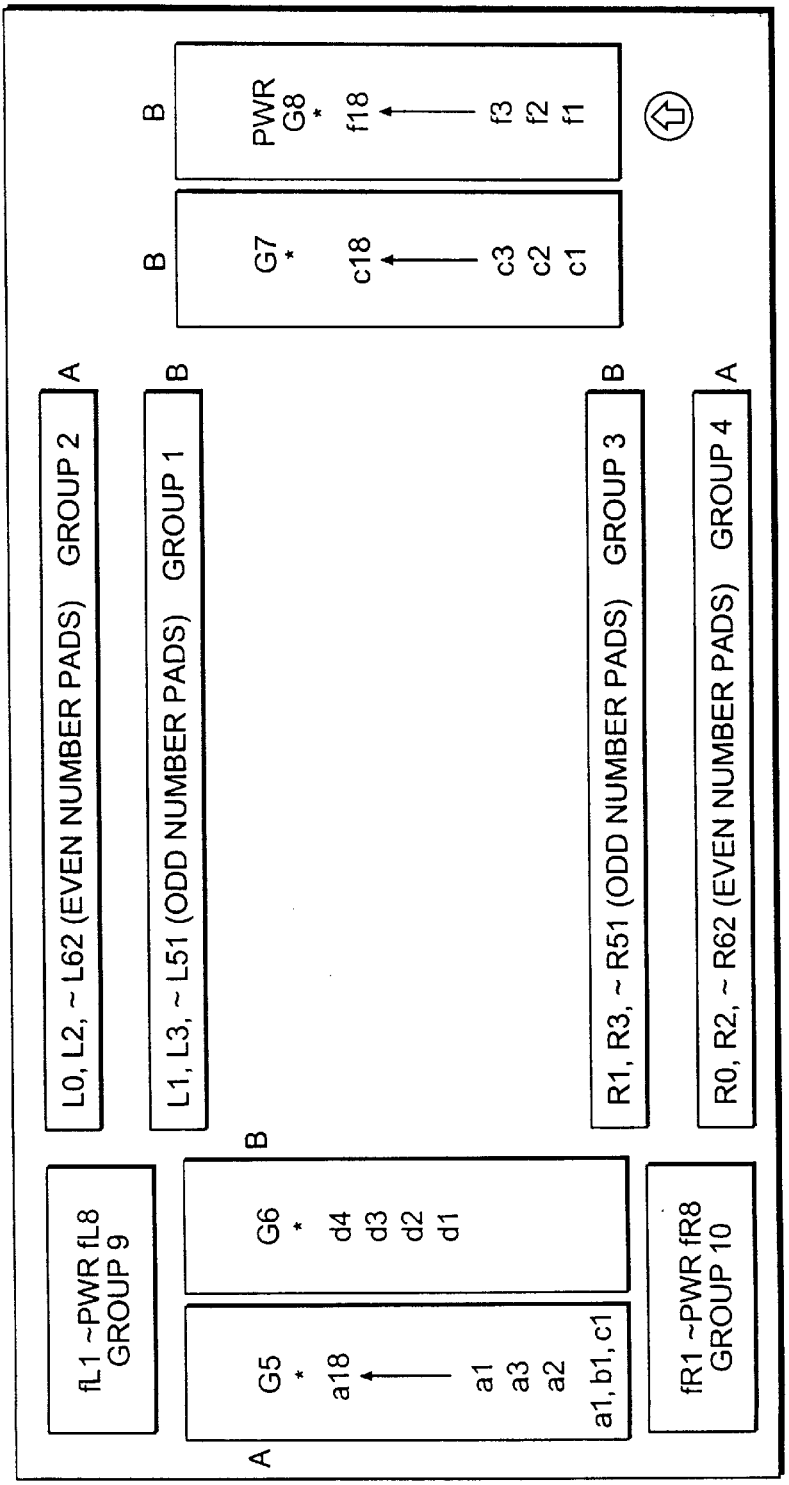
FIG. 10 illustrates one arrangement of bonding pads on an interconnect die 400 that may be used consistent with the present invention.

Each interconnect die 400 may include a sufficient number of interconnection arrangements for use with multiple different types of IC dies 100 and/or multiple locations within the multi-chip module. Alternatively, several different interconnect die designs may be used depending on the function to be performed by the die. FIG. 10 illustrates an embodiment of an interconnect die 400 in which the bonding pads 430 are arranged in pad groups 430-n, for example, ten pad groups 430-1 to 430-10. The pad groups 430-n may be arranged to perform multiple different interconnect functions depending on the location of the die within the multichip module 10. For example, the ten pad groups 430-1 to 430-n may be arranged to support two separate functions, which will be referred to as an A function and a B function. An interconnect die connected to perform an A function will be referred to as an interconnect die 400-A and an interconnect die connected to perform a B function will be referred to as an interconnect die 400-B.

Interconnect die 400-A uses pad groups 430-2, 4304 and 430-5 to complete interconnections between two IC dies 100. Interconnect die 400-B uses pad groups 430-1 430-3, 430-6, 430-7, and 430-8 to complete interconnection of control signals between two IC dies. Pad groups 430-9 and 430-10 provide power and ground connections to pad group 430-8. Pad group 430-5 provides, for example, 54 connections to the leads 300. To reduce congestion of wires on the printed circuit board to which the multi-chip module 10 may be connected, overflow wires from pad group 430-5 may be coupled to pad group 430-9 and 430-10.

Each power and ground pad of the IC dies 100 may be bonded to two bonding pads on the interconnect dies 400. The power and ground pads of the interconnect dies 400 may then be double-bonded to the leads 300. Within the interconnect dies 400, the power/ground lines may be separate from one another to provide an added measure of flexibility and to reduce lead and packaging inductance. The interconnect dies 400 may include NC pads ("No Connect" pads—a land to attached one bridge panel to promote jumpering between another pad which is harder to bond) for which there is no connection. These pads may be provided to match NC pads of the IC dies 100 to give the best bonding angles. Not all of the bonding pads of the interconnect dies 400 need to be connected. Bonding pads may be left unconnected without interfering with the operation of other bonding pads that are connected.

Figure 11:
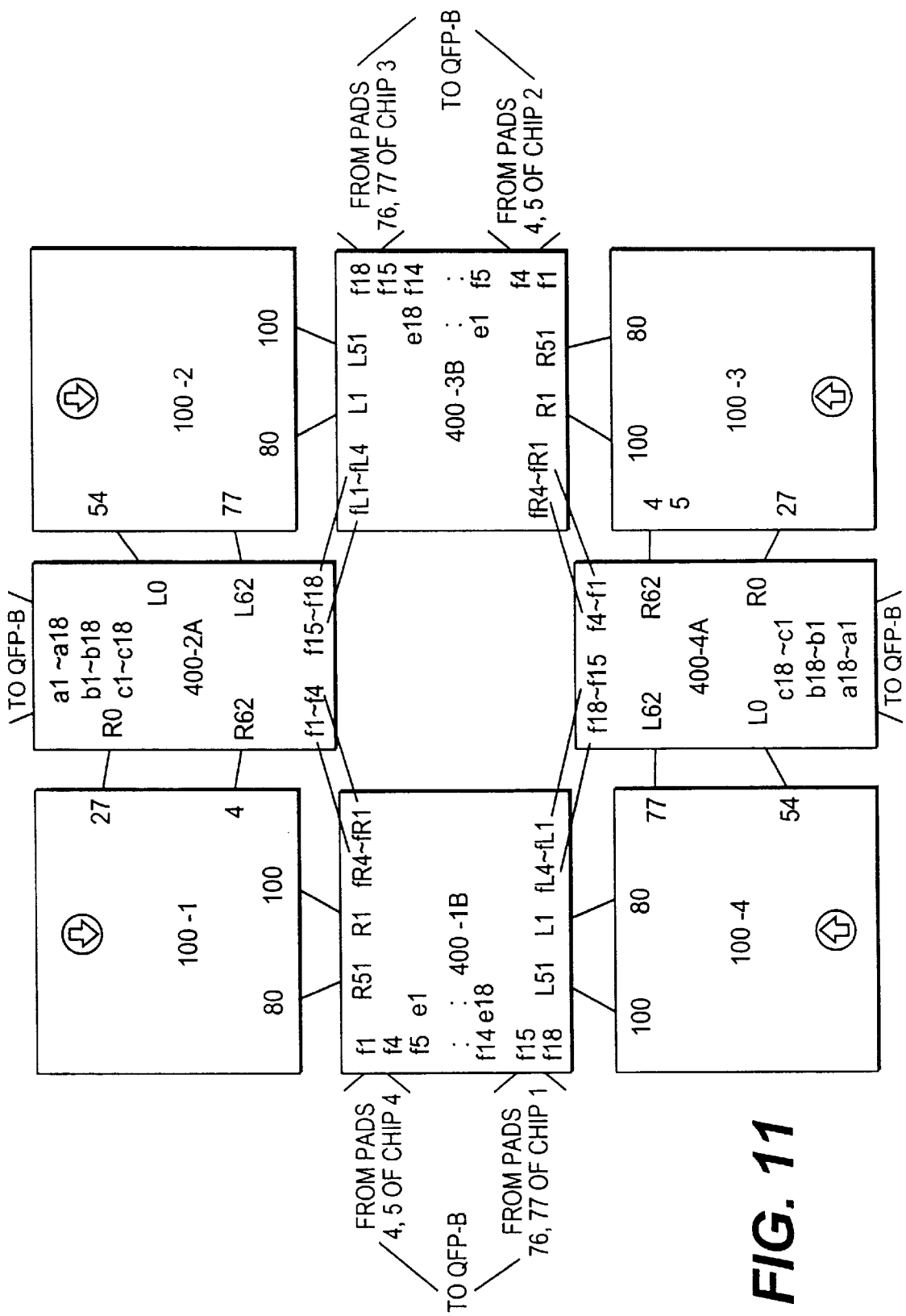
FIG. 11 illustrates one way of interconnecting IC dies using the interconnect dies shown in FIG. 10.

As shown in FIG. 11, pads of pad group 430-S serve a different purpose in interconnect dies 400-1B and 400-3B as they do in interconnect dies 400-2A and 400-4A. For example, the bonding pads of pad group 5 may be used by interconnect dies 400-2A and 400-4A to connect to leads 300. In contrast, the bonding pads of pad group 8 may be used by interconnect dies 400-1B and 400-3B to connect to leads 300. As a further example, power pads 4, 5 of IC die 100-1 may be coupled to bonding pads 56, 58 and 60, 62, respectively, of interconnect die 400-2A. Bonding pads 56, 58, 60, and 62 then couple to bonding pads f1, f2, f3, and f4, respectively, of interconnect die 400-2A. Bonding pads f1, f2, f3, and f4 of interconnect die 400-2A couple to bonding pads fR1, fR2, fR3, and fR4, respectively, of interconnect die 400-1B. Bonding pads fR1, fR2, fR3, and fR4 interconnect die 400-1B couple to bonding pads f1, f2, f3, and f4, respectively, of interconnect die 400-1B, which in turn couple to leads 300. The other IC dies 100-2, 100-3, and 100-4 may be similarly connected through the interconnect dies. In a situation were the use of several packages with multiple bonding and board traces is necessary, this arrangement serves to reduce the number of bond wires from the interconnect dies 400 to the leads 300.

Returning to FIG. 1, the IC dies 100, the leads 300, and the interconnect dies 400 are interconnected using conductive material 500. The conductive material 500 may include wire bonding, tape automated bonding, or other well known bonding methods. FIG. 1 shows that the four interconnect dies 400 are arranged such that interconnect die 400-2 and interconnect dies 400-3 are end-to-end and separate interconnect dies 400-1 and 400-4. This arrangement facilitates interconnections between the interconnect dies 400. Alternatively, a fifth interconnect die 400-5 may be provided at the intersection of the four interconnect dies 400-1, 400-2, 400-3, and 400-4, such that a side of the fifth interconnect die 400-5 is adjacent a side of each of the other four interconnect dies.

The multi-chip module 10 may be finished by encapsulating and/or capping to enclose and seal the interior of the module 10. Underfill or underside heat sinks may also be added. In one preferred embodiment. the multi-chip module 10 includes four SRAM IC dies, for example, Galvantech model number GVT71256E18Z, and four interconnect dies 400 mounted in a housing 200 with 516 leads 300 extending from the side walls thereof in three, vertically-spaced tiers.

Figure 12:
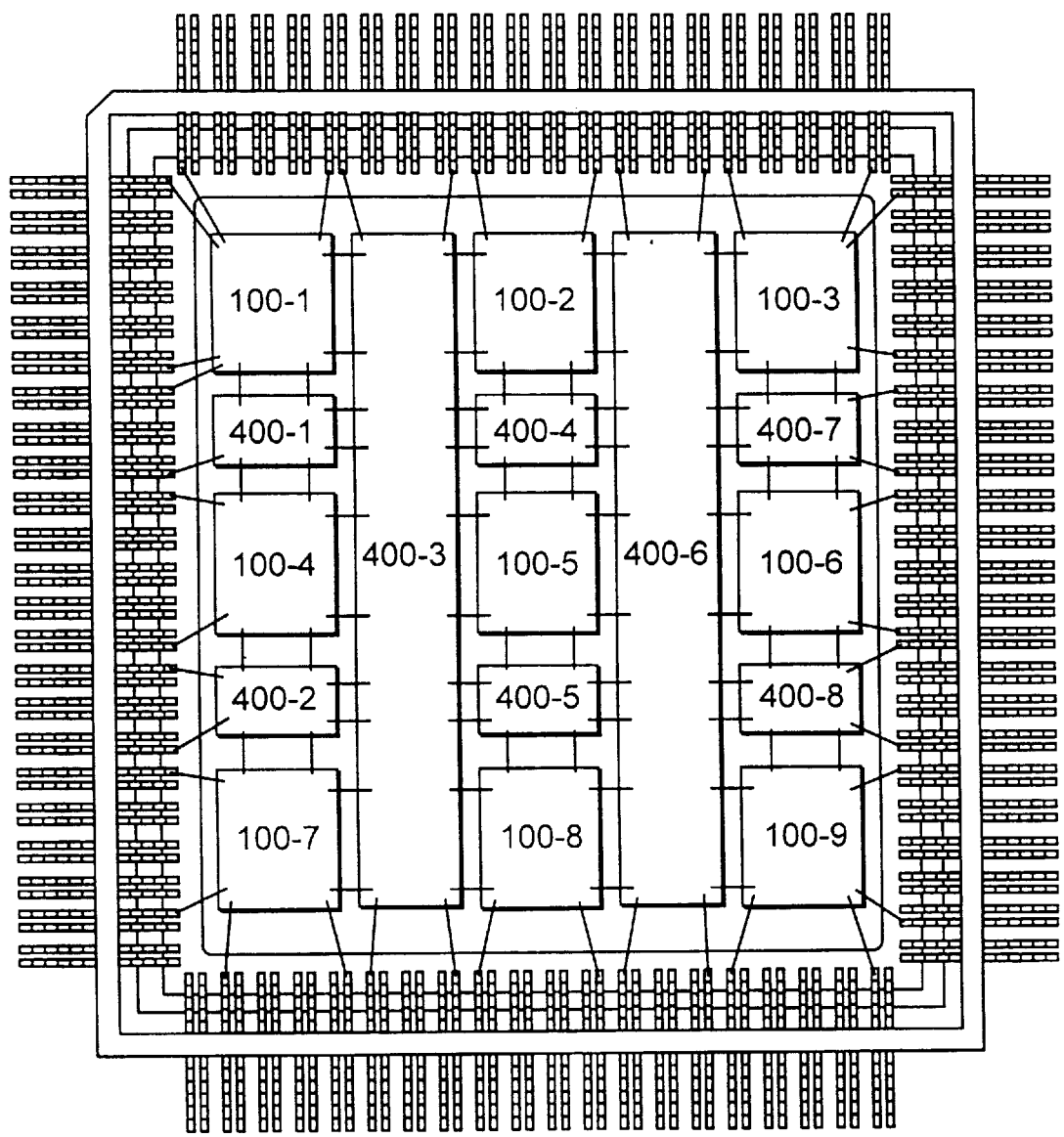
FIG. 12 illustrates a farther embodiment of a multi-chip module in accordance with the present invention.

FIG. 12 illustrates a further embodiment of a multi-chip module 20 in accordance with the present invention. Multi-chip module 20 is similar to multi-chip module 10 described above, but includes a different number and arrangement of IC dies 100 and interconnect dies 400. As shown in FIG. 12, the multi-chip module 20 includes nine IC dies 100-1, 100-2, 100-3, 100-4, 100-5, 100-6, 100-7, 100-8, and 100-9. The IC dies 100 are connected by eight interconnect dies 400-1, 400-2, 400-3, 400-4, 400-5, 400-6, 400-7, and 400-8. Interconnect dies 400-1, 400-2, 400-4, 400-5, 400-7, and 400-8 may be relatively small dies interposed between pairs of IC dies. Interconnect dies 400-3 and 400-6 may extend from one side of housing 200 to another to thus divide the IC dies into three groups. In this way, the number of interconnections between IC dies and interconnect dies may be reduced to simplify manufacture. Thus, IC interconnect dies may be utilized in multiple applications.

It will be apparent to those skilled in the art that various modifications and variations can be made without departing from the scope or spirit of the invention. Other embodiments of the invention will be apparent to those skilled in the art from consideration of the specification and practice of the invention disclosed herein. For example, the multi-chip module may include any plural number of IC dies and at least one interconnect die, and different arrangements of IC dies and interconnected dies can be used and are intended to be within the scope of the invention. It is intended that the specification and examples be considered as exemplary only, with a true scope and spirit of the invention being indicated by the following claims.

What is claimed is:

1. A multichip module for housing multiple integrated circuit dies comprising:

a housing for holding a plurality of dies;

a plurality of integrated circuit dies mounted within said housing;

a plurality of interconnect dies mounted within said housing, each of said interconnect dies being physically located between at least two of said integrated circuit dies, wherein at least one of said interconnect dies is electrically connected to at least two of said integrated circuit dies and to at least one other said interconnect die; and a plurality of electrically conductive leads extending from said housing.

2. A multichip module according to claim 1, wherein each of said plurality of electrically conductive leads comprise an external lead portion extending outside of said housing and an internal lead portion extending inside said housing.

3. A multichip module according to claim 2, wherein said external lead portion of at least some of said electrically conductive leads is substantially L-shaped.

4. A multichip module according to claim 2, wherein said integrated circuit dies are electrically coupled to the internal lead portion of said leads.

5. A multichip module according to claim 1, wherein said integrated circuit dies are electrically coupled to said leads.

6. A multichip module according to claim 2, wherein at least some of said interconnect dies are electrically coupled to said leads.

7. A multichip module according to claim 6 wherein each of said interconnect dies are electrically coupled to said leads.

8. A multichip module according to claim 1, wherein electrical signals are communicated between at least two of said integrated circuit dies via at least two of said interconnect dies.

9. A multichip module according to claim 1, wherein at least one of said interconnect dies comprises:

a substrate;

first and second bonding pads on said substrate; and a wiring path formed on said substrate interconnecting said first and second bonding pads.

10. A multichip module according to claim 9, wherein said wiring path comprises plurality of conductive layers formed on said substrate.

11. A multichip module according to claim 1, wherein said housing comprises a plurality of side walls and an end plate.

12. A multichip module according to claim 11, wherein said end plate includes a narrowed peripheral portion.

* * * * *